United States Patent
Ye et al.

(10) Patent No.: US 11,876,373 B2
(45) Date of Patent: Jan. 16, 2024

(54) POWER-AWARE METHOD, POWER-AWARE SYSTEM AND CONVERTER

(71) Applicant: HANG ZHOU NANO CORE CHIP ELECTRONIC TECHNOLOGY CO., LTD, Zhejiang (CN)

(72) Inventors: Le Ye, Hangzhou (CN); Heyi Li, Hangzhou (CN); Ru Huang, Hangzhou (CN); Yuanxin Bao, Hangzhou (CN); Hao Zhang, Hangzhou (CN)

(73) Assignee: HANG ZHOU NANO CORE CHIP ELECTRONIC TECHNOLOGY CO., LTD.

( * ) Notice: Subject to any disclaimer, the term of this patent is extended or adjusted under 35 U.S.C. 154(b) by 0 days.

(21) Appl. No.: 17/751,884

(22) Filed: May 24, 2022

(65) Prior Publication Data

US 2022/0385067 A1   Dec. 1, 2022

(30) Foreign Application Priority Data

May 26, 2021   (CN) .......................... 202110577977.X

(51) Int. Cl.
| | |
|---|---|
| *H02J 3/14* | (2006.01) |
| *H03M 1/00* | (2006.01) |
| *H03M 1/38* | (2006.01) |
| *H02J 13/00* | (2006.01) |

(52) U.S. Cl.
CPC .......... *H02J 3/14* (2013.01); *H02J 13/00036* (2020.01); *H03M 1/002* (2013.01); *H03M 1/38* (2013.01)

(58) Field of Classification Search
CPC .. H02J 3/14; H02J 13/00; H03M 1/00; H03M 1/38
USPC .................................................. 307/10.1, 31
See application file for complete search history.

(56) References Cited

U.S. PATENT DOCUMENTS

2004/0095266 A1*   5/2004   Kernahan ............... G05F 3/262
                                                              341/165

* cited by examiner

*Primary Examiner* — Arnold M Kinkead
(74) *Attorney, Agent, or Firm* — TIANCHEN LLC.; Yuan R. Li

(57) ABSTRACT

Disclosed are a power-aware method, a power-aware system and a converter. The power-aware method includes: receiving an input signal, wherein the input signal is a capacitive type, a resistive type, a voltage type or a current type, coarsely quantizing the input signal and outputting a numerical control code, the numerical control code indicating size information of the input signals, and turning on a corresponding number of power-consuming modules based on the numerical control code. By the power-aware method, the power-aware technical effect of a circuit may be provided and turned-on power-consuming modules always have the most suitable number regardless of the size of the input signals, which may ensure normal operation, and will not waste power consumption due to too many power-consuming modules and energy efficiency is improved as a whole.

11 Claims, 2 Drawing Sheets

POWER-AWARE METHOD, POWER-AWARE SYSTEM AND CONVERTER

The present disclosure claims the priority of Chinese patent application under CN202110577977.X filed on May 26, 2021. The contents of the aforementioned application are incorporated herein by reference in its entirety.

TECHNICAL FIELD

The present application relates to the technical field of integrated circuits, and in particular, to a power-aware method, a power-aware system and a converter.

BACKGROUND

With the rapid development of integrated circuit technology, emerging application technologies such as the Internet of Things (IoT) have gradually entered people's field of vision. The core of the IoT technology is an IoT chip, which has the characteristics of ultra-low power consumption, low cost, and high integration. The IoT chip is further subdivided into a sensing layer, a processing layer, a communication layer, etc. The sensing layer is a link between a physical world and the digital world and may digitize natural environmental parameters (e. g., sound, light, temperature, humidity, acceleration, pressure, etc.) A circuit that converts an analog signal into a digital signal is referred to as an analog-to-digital converter (ADC), this circuit can be referred to as a capacitance-to-digital converter (CDC) when an input signal is a capacitance and this circuit can be referred to as a current-to-digital converter (IDC) when an input signal is a current. The circuit will have a large input dynamic range whether it is ADC, or CDC, or IDC in order to be compatible with different applications, while an internal circuit is often designed according to the maximum input in order to drive the input under all conditions, and the circuit can also operate normally in the "most severe" situation.

However, when an input signal is small, a serious waste of power consumption will be caused in an internal circuit having an input designed according to the maximum input in order to being driven in all cases. Further, it will bring an increase in noise level even due to the excessive design of the driving current, which affects the performance and accuracy of circuit operation, etc.

SUMMARY

In order to solve technical problems above, the present application provides a power-aware method, a power-aware system and a converter in which an appropriate number of power-consuming modules are turned on to save power consumption when the input signal is small.

The present application provides a power-aware method, including the following steps:
  receiving an input signal, wherein the input signal is a capacitive type, a resistive type, a voltage type or a current type,
  coarsely quantizing the input signal and outputting a numerical control code, the numerical control code indicating size information of the input signals, and
  turning on a corresponding number of power-consuming modules based on the numerical control code.

The present application also provides a power-aware system, including:
  a quantizing module, configured to receive an input signal, wherein the input signal is a capacitive type, a resistive type, a voltage type or a current type, and coarsely quantize the input signal and output a numerical control code, the numerical control code indicating size information of the input signals, and
  a power-aware array, configured to turn on a corresponding number of power-consuming modules based on the numerical control code output by the quantizing module.

The application also provides a converter, including the power-aware system.

By the power-aware method, the power-aware system and the converter according to the present application, the waste of power consumption caused by the traditional circuit designed according to the maximum input in order to drive the input in all cases is overcome, the power-aware technical effect of a circuit may be provided and the power-consuming modules turned on always have the most suitable number regardless of the size of the input signals, which may ensure normal operation, and will not waste power consumption due to too many power-consuming modules and energy efficiency is improved as a whole.

BRIEF DESCRIPTION OF THE DRAWINGS

In order to illustrate embodiments of the present application or the technical solutions in the related art more clearly, drawings that need to be used in the embodiments and related art are briefly introduced. The drawings in the following description are some embodiments of the present application and other drawings can also be obtained based on these drawings without any creative efforts for those of ordinary skill in the art.

DETAILED DESCRIPTION

In order to make the objectives, technical and advantages of the present application clearer, the technical solutions in the embodiments of the present application will be clearly and completely described below with reference to the drawings in the embodiments of the present application. The described embodiments are a part but not all of the present application. All other embodiments obtained by those of ordinary skill in the art based on the embodiments of the present application without creative efforts shall fall within the protection scope of the present application.

In order to make the technical solutions of the present application clearer, the embodiments of the present application will be described in detail below with reference to the drawings.

Embodiment 1

Figure 1:
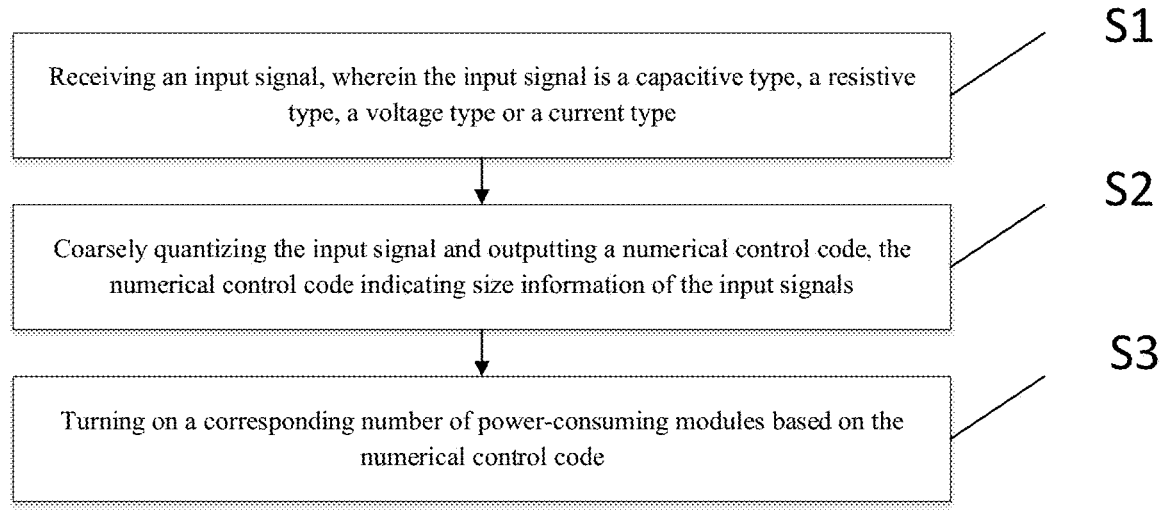
FIG. 1 shows a schematic flow chart of a power-aware method according to Embodiment 1 of the present application.

The present embodiment shows a power-aware method, as shown in FIG. 1, including the following steps:

S1. receiving an input signal, wherein the input signal is a capacitive type, a resistive type, a voltage type or a current type, S2, coarsely quantizing the input signal and outputting a numerical control code, the numerical control code indicating size information of the input signals, and S3. turning on a corresponding number of power-consuming modules based on the numerical control code.

Specifically, the coarsely quantizing the input signals is performed using a successive approximation method.

Preferably, a corresponding relationship between the numerical control code and the number of the power-consuming modules to be turned on is preset according to historical data.

Preferably, each of the power-consuming modules is an inverter amplifier powered by a floating capacitor or an integrator designed based on an inverter amplifier powered by a floating capacitor, or an inverter amplifier powered by a direct voltage or an integrator designed based on an inverter amplifier powered by a direct voltage.

This embodiment is designed based on a successive approximation register (SAR) algorithm, and then the number of power-consuming modules to be turned on is determined according to the size of the input signal. The power consumption overhead is minimized under the condition of ensuring the normal operation of the circuit, and a large input dynamic range is also ensured. By the method, it may effectively ensure that the chip can maintain the best energy efficiency in the entire input dynamic range. In addition, post-stage power-consuming modules can be adaptively configured based on the input signals without manual configuration due to the existence of coarse quantization in the present embodiment. Manually configuring the number of turned-on power-consuming modules is also an option of this embodiment. Both adaptive configuration and manual configuration are supported.

In this embodiment, other coarsely quantizing methods may also be used in other embodiments although coarsely quantizing may be performed using the SAR algorithm.

Embodiment 2

Figure 2:
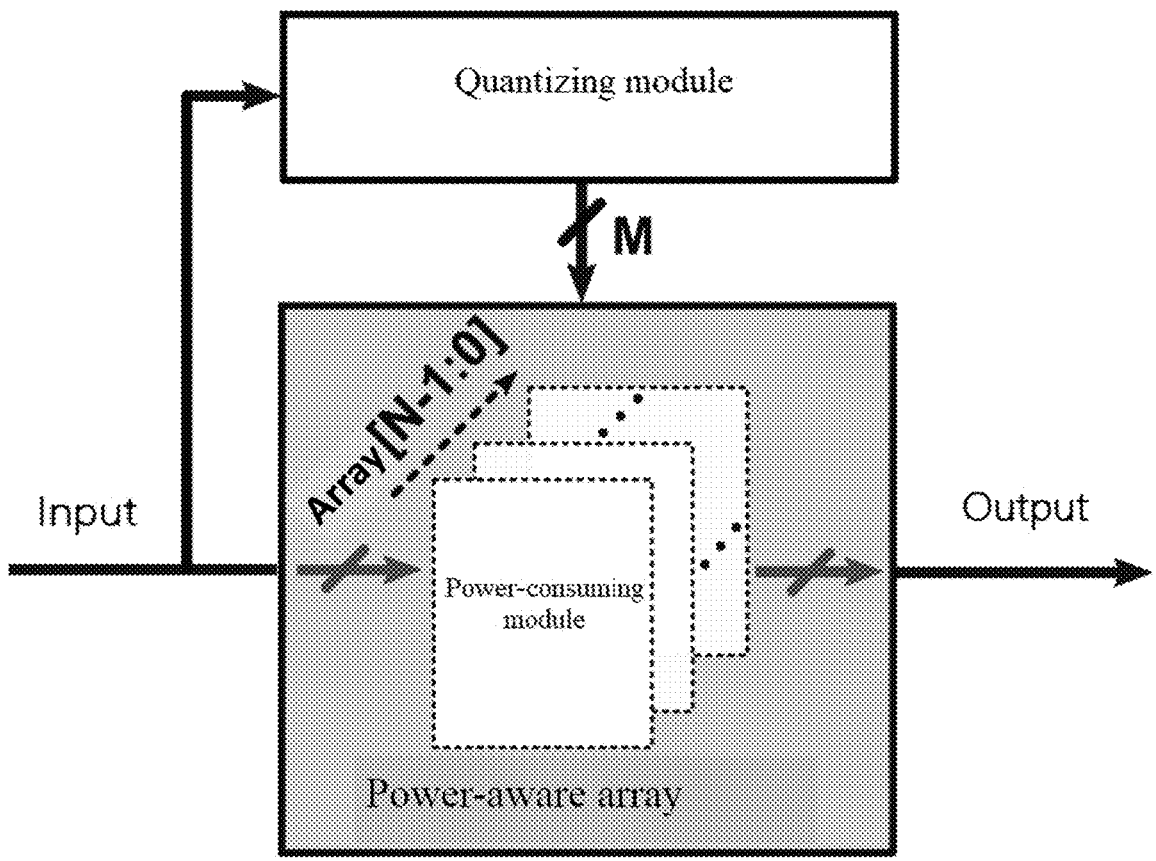
FIG. 2 shows a structural schematic diagram of a power-aware system according to Embodiment 2 of the present application.

The present embodiment shows a power-aware system, as shown in FIG. 2, including:
- a quantizing module, configured to receive an input signal, wherein the input signal is a capacitive type, a resistive type, a voltage type or a current type, and coarsely quantize the input signal and output a numerical control code, the numerical control code indicating size information of the input signals, and
- a power-aware array, configured to turn on a corresponding number of power-consuming modules based on the numerical control code output by the quantizing module.

The power-aware array includes a plurality of power-consuming modules. In practical applications, the plurality of power-consuming modules in the power-aware system do not all need to operate. A converting circuit only needs to turn on some of the power-consuming modules to complete the information converting function when the input signal is small. In the present embodiment, a size of the input signal is initially obtained by coarsely quantizing the input signal, a numerical control code is output based on a coarsely quantized result and an appropriate number of power-consuming modules are controlled to be opened based on the numerical control code to avoid turning on all power-consuming modules, which ensures the normal operation of the circuit and will not consume too much power.

Further, the quantizing module includes a successive approximation register (SAR) and a digital-to-analog converter (DAC).

Preferably, the power-aware system further includes a comparator and a digital-to-analog converter (DAC).

Further, the power-aware system includes a delta-sigma modulator consisting of a first-order integrator or a multi-order integrator, the first-order integrator or the first-stage integrator in the multi-order integrator being a power-aware array.

Optionally, a output of a last-stage integrator in the power-aware system is input to a comparator for being compared and the power-aware system has a single-ended loop structure or a pseudo-differential loop structure.

A scale of the power-aware array in the power-aware array technology, that is, the number of power-consuming modules can be obtained from historical data, and the historical data can be determined based on the type, size and specific application of the actual input signal. In the power-aware array technology, the number of power-consuming modules turned on and off by the power-aware array is determined by the output result of the quantizing module.

Embodiment 3

Figure 3:
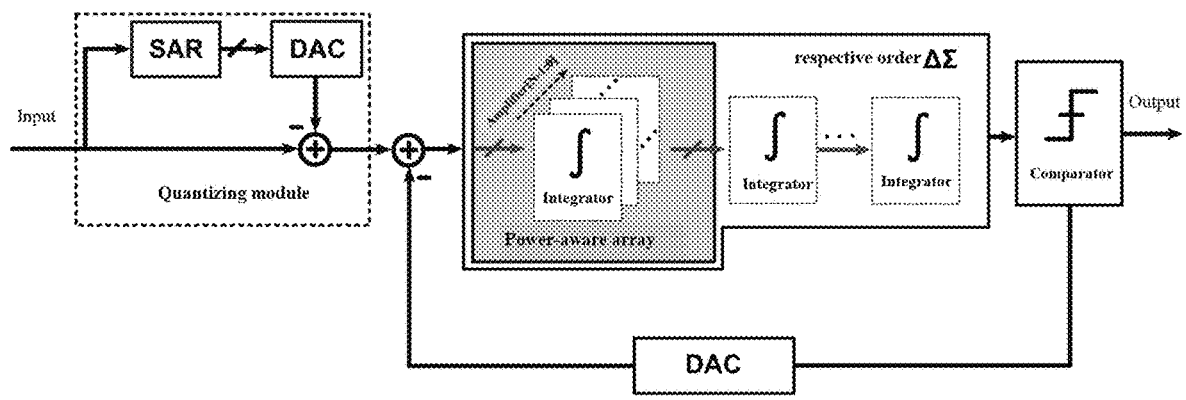
FIG. 3 is a structural schematic diagram showing an operation process of a power-aware system according to Embodiment 3 of the present application.

The present embodiment shows a power-aware system, including a quantizing module, a power-aware array, a comparator, and a digital-to-analog converter (DAC). FIG. 3 is the logic diagram of an operation process of the system. As shown in FIG. 3, the quantizing module is implemented based on a successive approximation register (SAR), but SAR needs to cooperate with the digital-to-analog converter (DAC) and a multi-bit data connection exits between the SAR and the DAC. The quantizing module is configured to perform a coarsely quantizing function, and will output a multi-bit numerical control code M, which indicates the size information of the input signal. N power-consuming modules in the power-aware array will be controlled by the numerical control code M. Specifically, the size of the input signal and the number of the turned-on power-consuming modules may be determined in advance through theoretical calculation or simulation, and a one-to-one mapping relationship is formed between the size of the input signal and the number of the turned-on power-consuming modules.

As again shown in FIG. 3, the numerical control code M output by the quantizing module will be input to the power-aware array including a plurality of power-consuming modules and N power-consuming modules will be controlled by the numerical control code M. Further, the power-aware system includes a delta-sigma modulator configured to finely quantize the input signal and consisting of a first-order integrator or a n-order integrator, where n is greater than or equal to 2. The first-order integrator or a first-stage integrator in the multi-order integrator is a power-aware array and post-stage integrators do not require a power-aware array since the first-order integrator is directly connected to an input capacitor and the input capacitor is dynamically changed. The power-aware system further includes a comparator and a digital-to-analog converter, an output of a last-stage integrator in the power-aware system is input to a comparator for being compared and the power-aware system has a single-ended loop structure or a pseudo-differential loop structure.

As an alternative embodiment, the power-aware system in the present embodiment may also be regarded as a zoom digital-to-analog converter (ADC), a capacitance-to-digital converter (CDC) or a current-to-digital converter (IDC), etc. The quantizing module of the system is a SAR ADC, which can roughly quantize the input signal (such as voltage, current, capacitance, resistance, etc.) into a numerical control code to control post-stage power-aware array. A loop of the SAR ADC includes but is not limited to a SAR logic module, a DAC module or a comparator module, etc. which has a function of quantizing the input signal into a numerical control code through successive comparisons. The output numerical control code is then used to control the number of power-aware arrays that are turned on so as to adaptively allocate the driving capability of the post-amplifier based on the input signal. Coarsely quantizing is performed by the SAR ADC Loop, while finely quantizing is performed by a delta-sigma modulator (DSM). The delta-sigma modulator may use a first-order integrator, a second-order integrator, a third-order integrator and etc. An output of the last-order integrator is input to the comparator for being compared. The loop structure can be single-ended or pseudo-differential. An output of the comparator controls a digital-to-analog converter (DAC) to feed back output information of the delta-sigma modulator to the input of the delta-sigma modulator. The second-order, third-order and higher-order integrators of the delta-sigma modulator can usually be designed to be driven by a fixed current since a sampling capacitance is fixed.

A core principle for providing high efficiency in the present embodiment is that the system can allocate power consumption as needed since different input sizes require different power consumption overheads when finely quantizing is performed in the subsequent stages. In general, in case of the same bandwidth, large inputs, especially in capacitive-to-digital converters (CDCs) mean larger RC delays and a virtual point requires a larger current drive to "complete establishment" (i.e., meet the minimum establishment error) at the specified bandwidth. In the case of small input signal, the required current driving capacity is relatively small. Based on this requirement, the present application designs a module for sensing the size of the input. The output of the module will determine the number of post-stage power-consuming modules to be turned on. The number of turned-on power-consuming modules is just enough to drive the input of the preceding stage, which ensures the accuracy of the circuit, saves power consumption to a maximum extent and thus ensures energy efficiency in the entire dynamic range of the input. The present application can be used in analog-to-digital converters, capacitance-to-digital converters and other chips that require high efficiency, significantly improve the energy efficiency of the chips, and play greater roles in future Internet of Things, artificial intelligence, integrated storage and computing chips, communication chips, and biological sensor chips, sensor chips and other fields.

The present embodiment can significantly improve the energy efficiency level of the chip, and is extremely suitable for application scenarios that require ultra-low power consumption, and can accelerate the promotion of future Internet of Things, artificial intelligence, integrated storage and computing chips, communication chips, and biological sensor chips, sensor chips and other fields.

Embodiment 4

Figure 4:
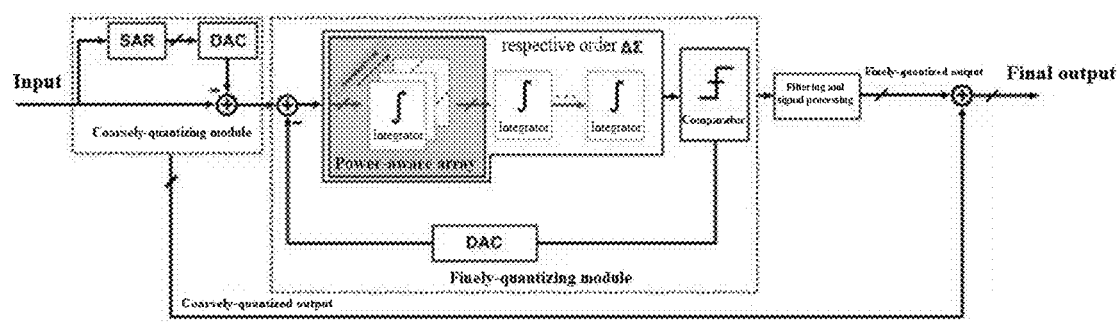
FIG. 4 shows a structural schematic diagram of a power-aware system according to Embodiment 4 of the present application.

A converter includes the power-aware system in the above embodiments. The converter may be an analog-to-digital converter, a capacitance-to-digital converter, or a current-to-digital converter. The analog-to-digital converter is used as an example for description below. The analog-to-digital converter is an analog-to-digital converter based on a Zoom architecture. The Zoom-type analog-to-digital converter has a characteristic of two-stage quantization. As shown in FIG. 4, the first-stage quantization includes coarse quantization, the second-stage quantization includes fine quantization and filtering and signal processing. A finally quantized result is determined jointly based on coarse quantization and fine quantization. The coarse quantization provides not only a function of quantizing information, but also a function of sensing a size of an input of the "quantizing module". That is, a process of extracting the input information by the "quantizing module" basically does not increase the additional power consumption. Therefore, through the power-aware function of the present embodiment, the power consumption is saved and the energy efficiency is improved by allocating the power-aware array through adaptive control without substantially increasing the power consumption.

It should be noted that the above embodiments are only used to explain the technical solutions of the present application, and are not limited thereto. Although the present application is described in detail with reference to the foregoing embodiments, it should be understood by those skilled in the art that the technical solutions described in the foregoing embodiments may be modified and equivalent replacements are made to a part of the technical features and these modifications and substitutions do not depart from scopes of the technical solutions of the embodiments of the present application.

What is claimed is:

1. A power-aware method, comprising the following steps:
   receiving an input signal, wherein the input signal is a voltage type or a current type,
   coarsely quantizing the input signal and outputting a numerical control code, the numerical control code indicating the size of the input signals, and
   turning on a corresponding number of power-consuming modules based on the numerical control code, wherein a corresponding relationship between the numerical control code and the number of the power-consuming modules to be turned on is preset according to historical data.

2. The power-aware method of claim 1, wherein coarsely quantizing the input signals is performed using a successive approximation method.

3. The power-aware method of claim 2, wherein each of the power-consuming modules is an inverter amplifier powered by a floating capacitor or an integrator designed based on an inverter amplifier powered by a floating capacitor, or an inverter amplifier powered by a direct voltage or an integrator designed based on an inverter amplifier powered by a direct voltage.

4. A power-aware system, comprising:
   a quantizing module, configured to receive an input signal, wherein the input signal is a voltage type or a current type, and coarsely quantize the input signal and output a numerical control code, the numerical control code indicating the size of the input signals, and
   a power-aware array, configured to turn on a corresponding number of power-consuming modules based on the numerical control code output by the quantizing module, wherein a corresponding relationship between the numerical control code and the number of the power-consuming modules to be turned on is preset according to historical data.

5. The power-aware system of claim 4, wherein the power-aware array comprises a plurality of power-consuming modules.

6. The power-aware system of claim 4, wherein the quantizing module comprises a successive approximation register and a digital-to-analog converter.

7. The power-aware system of claim 4, wherein the power-aware system further comprises a comparator and a digital-to-analog converter.

8. The power-aware system of claim 4, wherein the power-aware system comprises a delta-sigma modulator consisting of a first-order integrator or a multi-order integrator, the first-order integrator or a first-stage integrator in the multi-order integrator being a power-aware array.

9. The power-aware system of claim 8, wherein an output of a last-stage integrator in the power-aware system is input to a comparator for being compared.

10. The power-aware system of claim 9, wherein the power-aware system has a single-ended loop structure or a pseudo-differential loop structure.

11. A converter, comprising the power-aware system of claim 4.

* * * * *